United States Patent [19]

Ammann et al.

[11] Patent Number: 5,335,405
[45] Date of Patent: Aug. 9, 1994

[54] METHOD AND APPARATUS FOR ALIGNING PHOTOTOOLS FOR PHOTOPROCESSING OF PRINTED CIRCUIT BOARDS

[75] Inventors: Hans H. Ammann, Chester; Richard F. Kovacs, Morris Plains; Henry B. Micks, Jr., Richmond; Jamey N. Potechin, Oak Ridge; Everett F. Simons, Cedar Knolls; John G. Tetz, Succasunna, all of N.J.

[73] Assignee: AT&T Bell Laboratories, Murray Hill, N.J.

[21] Appl. No.: 69,657

[22] Filed: Jun. 1, 1993

Related U.S. Application Data

[63] Continuation of Ser. No. 751,472, Aug. 29, 1991, abandoned.

[51] Int. Cl.5 .............................................. B23Q 7/00
[52] U.S. Cl. ........................................ 29/407; 29/467; 29/469; 29/559
[58] Field of Search .................. 29/407, 421.1, 464, 29/466, 467, 469, 559, 829, 830, 831, 846, 847; 269/21

[56] References Cited

U.S. PATENT DOCUMENTS

| | | | |
|---|---|---|---|
| 3,536,555 | 10/1970 | Thompson, Jr. | 29/559 X |
| 4,721,383 | 1/1988 | Simons | 355/91 |
| 4,793,052 | 12/1988 | Ammann et al. | 29/559 |
| 5,014,413 | 5/1991 | Ammann | 29/559 |

FOREIGN PATENT DOCUMENTS

| | | | |
|---|---|---|---|
| 0234591 | 2/1987 | European Pat. Off. | |
| 129586 | 11/1978 | Japan | 269/21 |

OTHER PUBLICATIONS

"Handbook of Printed Circuit Manufacturing" by R. H. Clark Van Nostrand Reinhold Co. pp. 159–165.
"Printed Circuits Handbook" by C. F. Coombs, Jr. McGraw-Hill Book Co. pp. 6-17 to 6-18.
Catalog Sheet TN-850 Ono Sokki Co.
Hitachi Chem Co., Ltd., Shiozaki Harumi, Abstract.

*Primary Examiner*—Joseph M. Gorski
*Attorney, Agent, or Firm*—Alfred G. Steinmetz

[57] ABSTRACT

Phototools are located for processing both sides of printed circuit board panels by an apparatus and process that utilizes a work station with two alignment fixtures each including panel center registration PCR alignment mechanism to locate phototools and panels. Processing steps utilize the alignment fixtures to locate phototools on both sides of a panel. Each of the two phototools is initially positioned on its alignment fixture by the PCR alignment mechanism and secured to its alignment fixture by means of a vacuum supplied by a vacuum chuck which is operative as the top surface of the alignment fixture. The panel is then placed on top of the first phototool and aligned to the first phototool in the first alignment fixture using the PCR alignment mechanism. This first phototool is then affixed to the first side of the panel. The panel with the attached first phototool is then placed on the second phototool in the second alignment fixture and aligned to the second phototool using the PCR alignment mechanism. The second phototool is then affixed to the second side of the panel. The phototool-panel-phototool package is then placed in a printer for exposure.

10 Claims, 5 Drawing Sheets

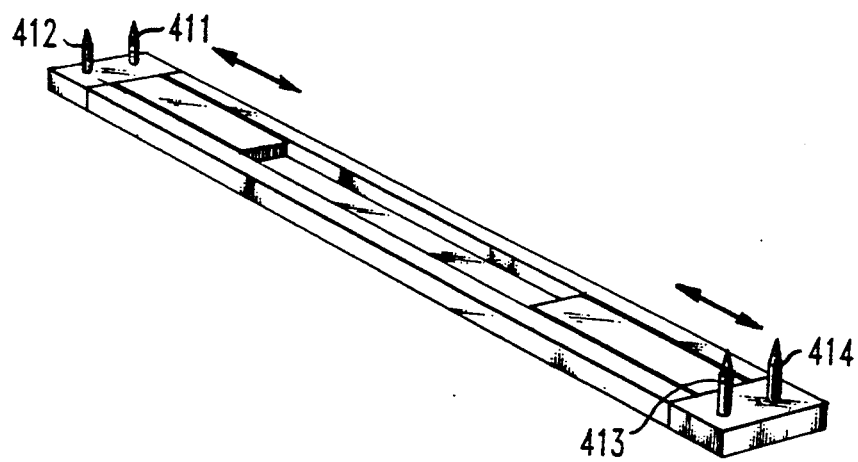
FIG. 4
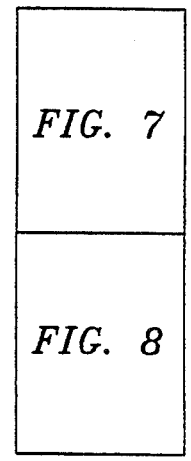
FIG. 12
FIG. 7
FIG. 8
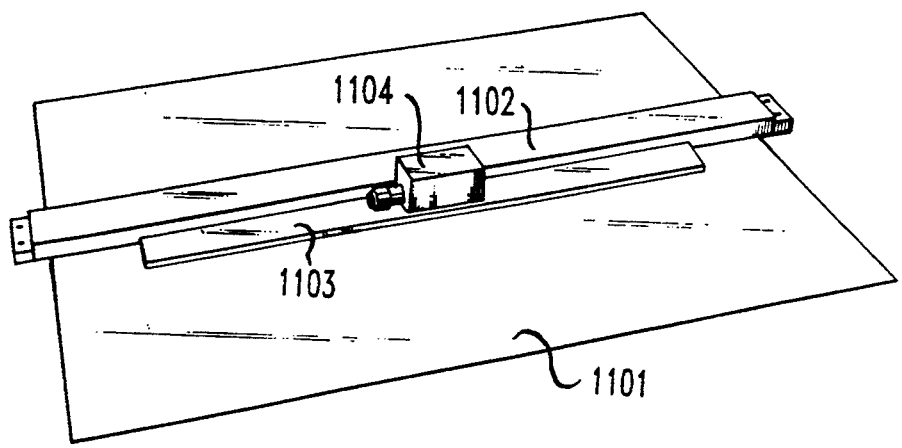
FIG. 11
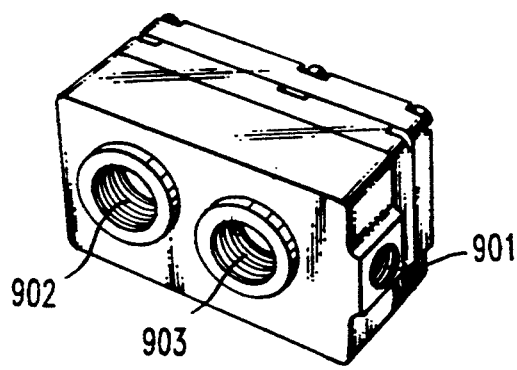
FIG. 9
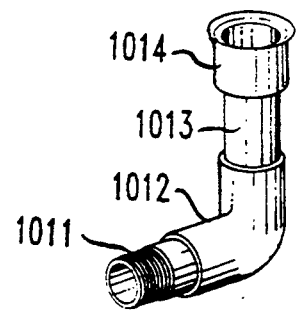
FIG. 10

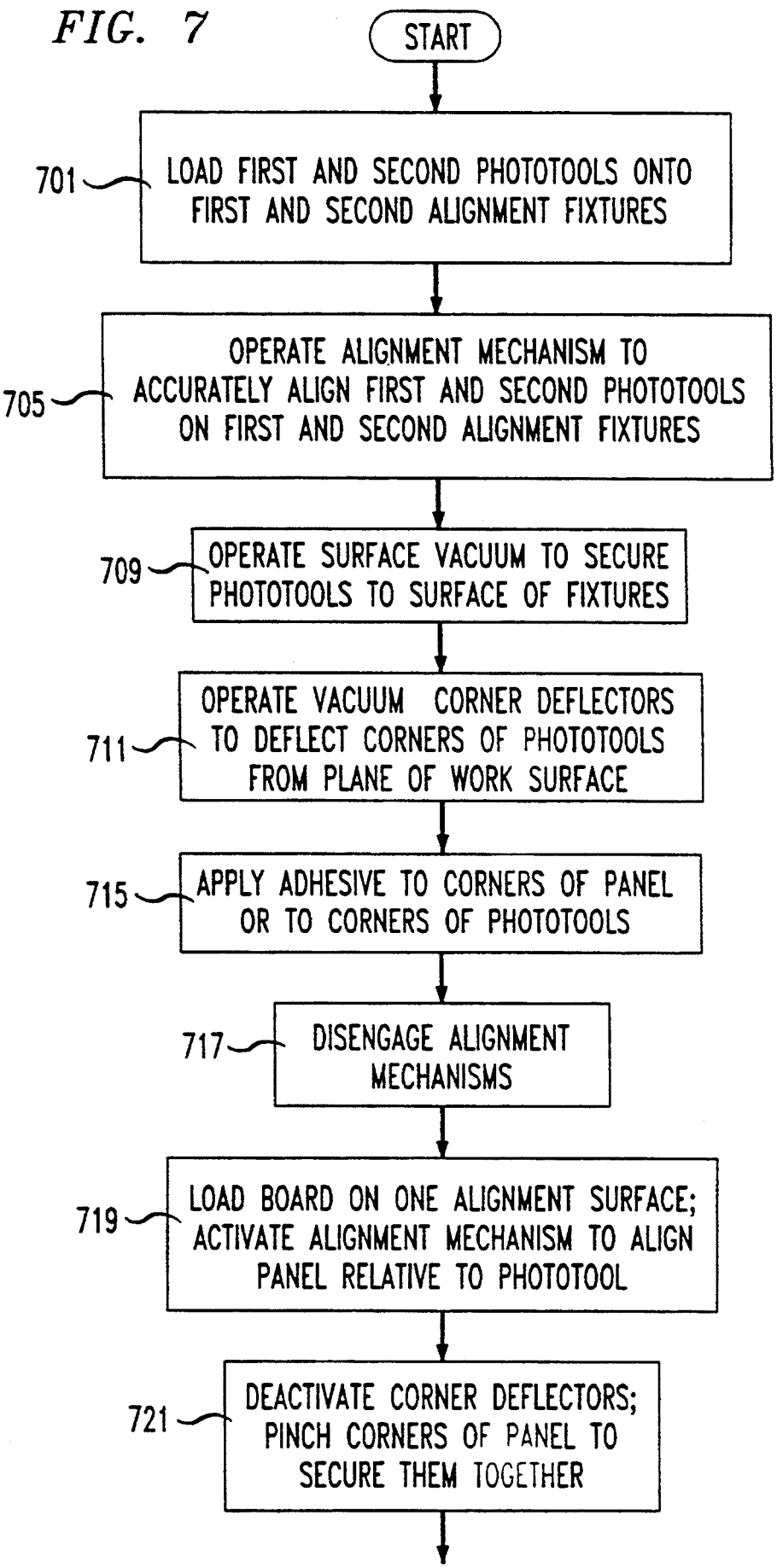

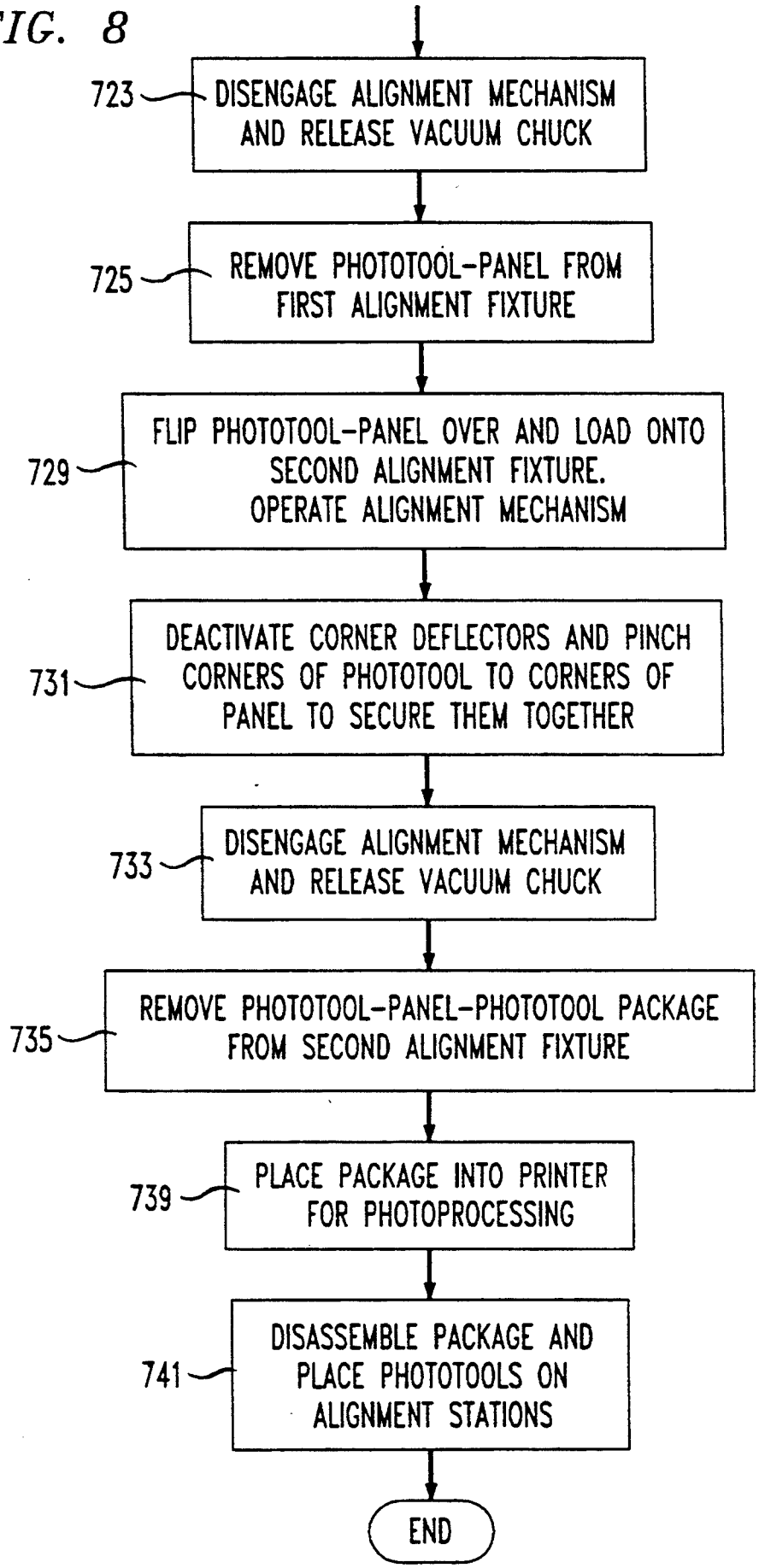

METHOD AND APPARATUS FOR ALIGNING PHOTOTOOLS FOR PHOTOPROCESSING OF PRINTED CIRCUIT BOARDS

This application is a continuation of application Ser. No. 07/751,472, filed on Aug. 29, 1991 and now abandoned.

FIELD OF THE INVENTION

This invention relates to an apparatus and method for accurately aligning two or more flat objects. It is particularly concerned with aligning and attaching phototools on opposite sides of a printed circuit board panel.

BACKGROUND OF THE INVENTION

Photoprocessing of printed circuit board panels for the etching and deposition of patterns on the printed circuit board panel surfaces requires accurate positioning of the patterns on the phototools relative to patterns (e.g., drilled holes, copper features) already defined on the printed circuit board panel.

Techniques presently used in aligning the phototools to the printed circuit board panels range from "eye-bailing it" to the use of complex vision feedback systems to position the phototools. Examples of more accurate extant processes are very labor intensive and often require expensive panel-phototool positioning operations or complex aligning equipment. These existing processes are often very dependent on operator expertise for their accuracy.

SUMMARY OF THE INVENTION

Phototools are accurately aligned for processing both sides of printed circuit board panels (hereinafter referred to as panels) by an apparatus and process that preferably utilize a work station with two adjacent alignment fixtures each including a panel center registration (PCR) apparatus to align phototools and panels. Processing steps utilize the alignment fixtures to align phototools on both sides of a panel. Each of the two phototools is initially aligned on its own alignment fixture by the second PCR apparatus and secured to the alignment fixture by means of a vacuum applied by a vacuum gripping or clamping surface (designated as a vacuum chuck herein) which is also operative as the top surface of the alignment fixture. The panel is then placed on the first alignment fixture and then aligned relative to the same apparatus, thereby aligning the panel relative to the first phototool. The first phototool is then affixed to the first side of the panel with double sided adhesive tape. The panel, with the attached first phototool, is then turned over and placed on the second phototool in the second alignment fixture and aligned to the second phototool using the PCR apparatus. The second phototool is then affixed to the second side of the panel with double sided adhesive tape. The phototool-panelphototool package is then placed in a printer for exposure and photoprocessing.

In another embodiment the process may utilize a single alignment fixture in which the phototools are serially affixed in the single alignment fixture instead of the use of the parallel fixtures for processing as described above.

BRIEF DESCRIPTION OF THE DRAWING

In the drawing:

FIG. 4 is a pictorial view of apparatus to register panels and phototools to a reference point and axis;

FIGS. 7 and 8 are a flow process diagram describing a method of utilizing the work station to prepare the panels and phototools and photoprocess them;

FIG. 9 is a pictorial view of a vacuum pump suitable for use with the alignment fixture in FIG. 1;

FIG. 10 is a pictorial view of a deflector mechanism suitable for use in the alignment fixture of FIG. 1; and FIG. 11 is a pictorial view of the underside of the work surface of the alignment fixture of FIG. 1; and FIG. 12 is a schematic showing how FIGS. 7 and 8 are joined together.

DETAILED DESCRIPTION

Figure 1:
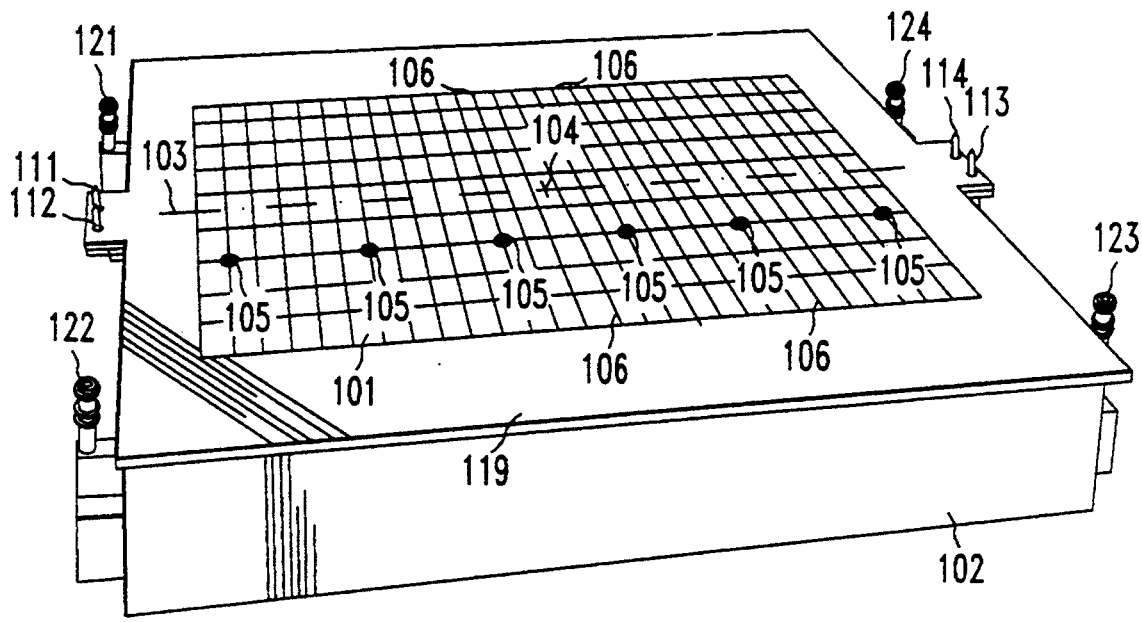
FIG. 1 is a pictorial view of an alignment fixture embodying the principles of the invention.
Figure 3:
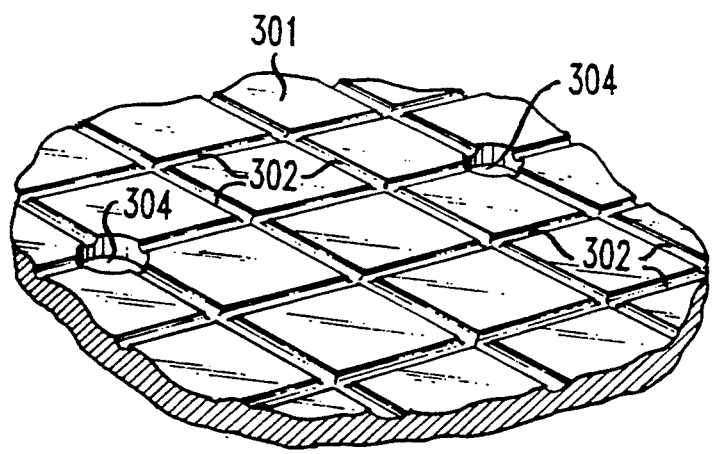
FIG. 3 is a fragmentary view of the features of the planar work surface of the alignment fixture of FIG. 1 for applying the vacuum grip to secure the panels to the fixture.

An alignment fixture embodying the principles of the invention is shown in FIG. 1. It includes a work surface 101 on which phototools may be positioned and which includes structural features, as shown in FIG. 3, to enable it to be operative as a vacuum chuck to secure the phototools to the surface 101 as discussed below. This surface 101 is supported by a structural support housing 102. An internal plenum and vacuum drawing mechanisms are attached to the underside of surface 101; this enables the surface 101 to draw a vacuum through a crisscrossing grid of channels 106 etched into surface 101, as discussed below with reference to FIG. 3, in order to activate the vacuum hold capability of the planar surface 101. The vacuum is applied through to the surface channels 302 by a plurality of apertures 304 joining the channels of the grid to a vacuum of the internal plenum. This vacuum is directly applied to these apertures by drawing a bulk vacuum in the plenum.

This vacuum may be applied by a manifold arrangement such as is shown in FIG. 11. The underside of the work surface of the alignment fixture is shown pictorially in FIG. 11. Attached to the underside of work surface 1101 are the locater mechanism 1102 (shown in FIG. 4), a vacuum plenum 1103 and a vacuum pump 1104 (shown in FIG. 9) connected to the vacuum plenum 1103. The vacuum plenum 1103 connects the vacuum pump 1104 (discussed herein with reference to FIG. 9) to the apertures in the work surface (shown as apertures 304 in FIG. 3). The vacuum manifold is comprised of an internal vacuum plenum, a port to connect the vacuum port of the vacuum pump 1104 to this plenum, and apertures in the work surface (shown as apertures 304 in FIG. 3) to connect this plenum to the grooves (302) in the work surface.

A functional gasket 119 is provided by the perimeter of the work surface to assist operation of the vacuum in holding phototools to the work surface. This functional gasket is provided by an edge of the work surface since the grid of the work surface is not extended to the perimeter and, hence, the flat surface at the edge or perimeter operates as an air sealing gasket. In a different type working surface, however, it may be necessary to provide a discrete gasket to achieve the desired vacuum seal.

Located at each corner of the alignment fixture, and external to the work surface 101, are vacuum actuated deflectors 121-124 each of which is placed at corners of the alignment fixtures in order to pull down the corners of the phototools (an adhesive is attached to corners of the phototools or the panel and must remain disengaged during alignment operations), deflecting them from the plane of the surface 101 during the positioning of a panel on top of the phototool secured to the surface 101. Each deflector has a suction grip device (suction cup) located slightly below the plane of the work surface 101 to prevent adhesive on the phototool from contacting the panel during positioning of the panel. The work surface is shaped and proportioned so that a portion of the phototool overhangs the working surface and can be readily engaged by the corner deflectors without interference from the work surface.

The corner deflectors 121-124 are simultaneously activated by use of a controlled vacuum pump or source directly activating all of the deflectors. Vacuum pumps energized by compressed air are commercially available and are suitable for application herein. These vacuum pumps use a venturi effect to generate a vacuum from a compressed airflow.

A suitable corner deflector apparatus for use with the alignment fixture of FIG. 1 is shown in FIG. 10. It includes a hollow threaded shank 1011 which may be attached to the side of the alignment fixture and may connect to a vacuum hose or manifold energized by a vacuum source such as disclosed in FIG. 9. The threaded shank 1011 is also connected to a 90 degree corner fitting 1012 which in turn is connected to vertical tubing 1013 which terminates in a flexible suction drawing cup 1014 which, when applied to the phototool and energized with vacuum, applies a holding suction thereto for deflecting the corners of the phototool below the plane of the working surface.

Figure 5:
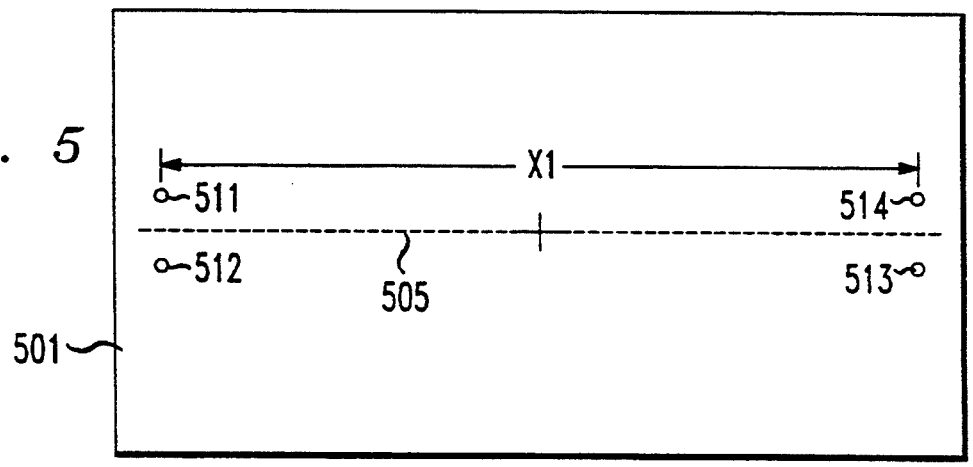
FIG. 5 is a pictorial view of a panel including structural features that interact with the apparatus to register panels and phototools shown in FIG. 4.
Figure 6:
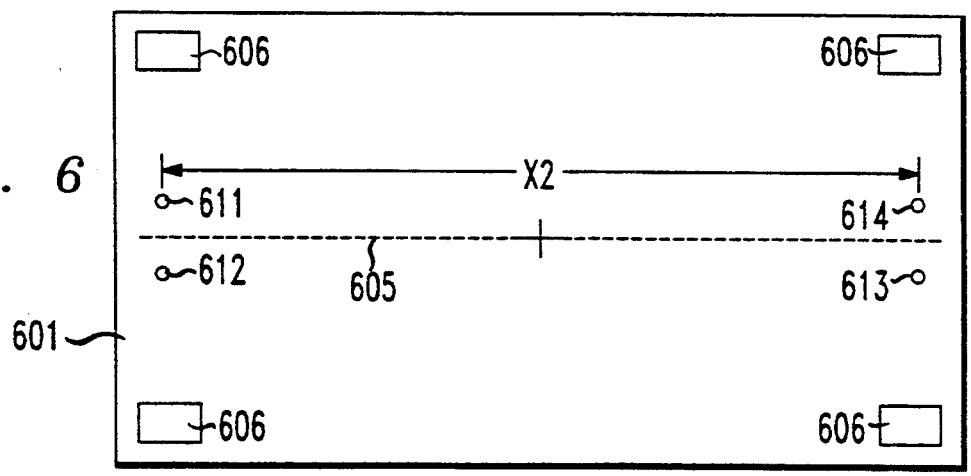
FIG. 6 is a pictorial view of a phototool including structural features that interact with the apparatus to register panels and phototools shown in FIG. 4.

Alignment of the phototools and panels is done by synchronized motion of four pins 111-114, which are grouped into the pairs 111-112 and 113-114. The pins of each pair are located near each other and astride a longitudinal axis (shown by dotted line 103) of the surface 101 at opposing sides of the alignment fixture. These pins 111-114 are operative as engaging elements that engage structural features (e.g., tooling holes or apertures) provided in the panels and phototools (as shown in FIGS. 5 and 6) in order to align them with respect to a reference point 104 and axis 103 of the alignment fixture. In particular the pins 111-114 engage holes in the panel or phototool and apply a synchronized opposing displacement of the pin pair 111-112 and 113-114, respectively, to position a point and axis of the panel or phototool substantially congruent with a point and axis of the alignment fixture. While alignment using a synchronized pin pair is shown, other alignment methods and apparatus may be used without departing from the spirit and scope of the invention.

The alignment mechanism, shown in pictorial form in FIG. 4, includes the alignment pins 411-414 which engage the apertures or holes in the panel and phototool to align it on the alignment fixture. The alignment pin pairs 411-412 and 413-414 are synchronously moved in opposing directions, as shown by the arrows of FIG. 4.

A detailed description of the structure and operation of this particular alignment mechanism is disclosed in U.S. Pat. No. 4,793,052 whose teaching is incorporated herein.

A detailed fragmentary pictorial view of the surface 101 (FIG. 1) is shown in the FIG. 3. A grid of channels 302 crisscrosses the surface 301. A plurality of holes 304 is located coincident with several intersections of these channels in the working surface. Through these holes the grid of channels 302 is supplied with the vacuum created by a vacuum drawn in the plenum of the alignment fixture. With the phototool on the surface the vacuum in the grid of channels firmly secures the phototool to the surface. This vacuum chuck preserves the location of the phototool after its reference frame has been aligned coincident with the reference frame established by the locater mechanism. The surface 301 may be comprised of metal such as copper, or a photo definable plastic. The channels of the surface may be created by conventional machining techniques or by photo patterned processes, A typical panel 501 to be processed is shown in FIG. 5 and is substantially rectangular in outline. Apertures or drilled holes 511-514 are provided to interact with the pins 111-114 of the locating mechanism of FIG. 1. The apertures are grouped into the paired apertures 511-512 and 513-514. The apertures of each pair are located astride the longitudinal axis 505 of the panel. The phototools 601 shown in FIG. 6 also include like apertures 611-614 grouped in pairs 611-612 and 613-614 astride a longitudinal axis 605 of the phototool. The length and width dimensions of the phototools typically exceed the corresponding dimensions of the work surface. While a longitudinal reference axis is shown in panels and phototools of the illustrative embodiment, it is to be understood that the invention may be practiced with other axes of the phototools and the panel selected.

A piece of double sided adhesive tape 606 is attached to the phototool surface and located at each corner of the phototool. Preferably the exposed adhesive is a low strength adhesive compared to the adhesive adhering to the phototool. This is to permit phototools to be readily removed from the panels after photoprocessing and permit extended reuse of the adhesive. The adhesive tape preferably remains on the phototool for multiple panel processing. While this tape is shown attached to the phototool it is to be understood that it could also be initially applied to the corners of the opposing panel surfaces shown in FIG. 5. In other alternative embodiments a single sided adhesive tape may be used which is attached to the phototool over an aperture permitting it to also adhere to the panel through the aperture.

The apertures in the panel and phototool are differentially located to allow independent alignment of the panel after the phototool has been secured in place on the working surface of the alignment fixture. For engagement pins actuating in an outward direction, the apertures in the panel are positioned just slightly closer to each other along the longitudinal axis 505 than the apertures in the phototool are to each other along the longitudinal axis 605. That is, the distance X1 between apertures of the panel is smaller than the distance X2 between apertures of the phototool. It is readily apparent that with this arrangement the apertures of the phototool 611-614 do not interfere with the alignment apparatus in positioning the panel. For engagement pins actuating inward, the engagement pins of the panel are positioned further apart along the longitudinal axis than those of the phototool. With a positioned phototool in place, the panel may be aligned without the alignment pins experiencing interference from the holes in the already positioned phototools.

Figure 2:
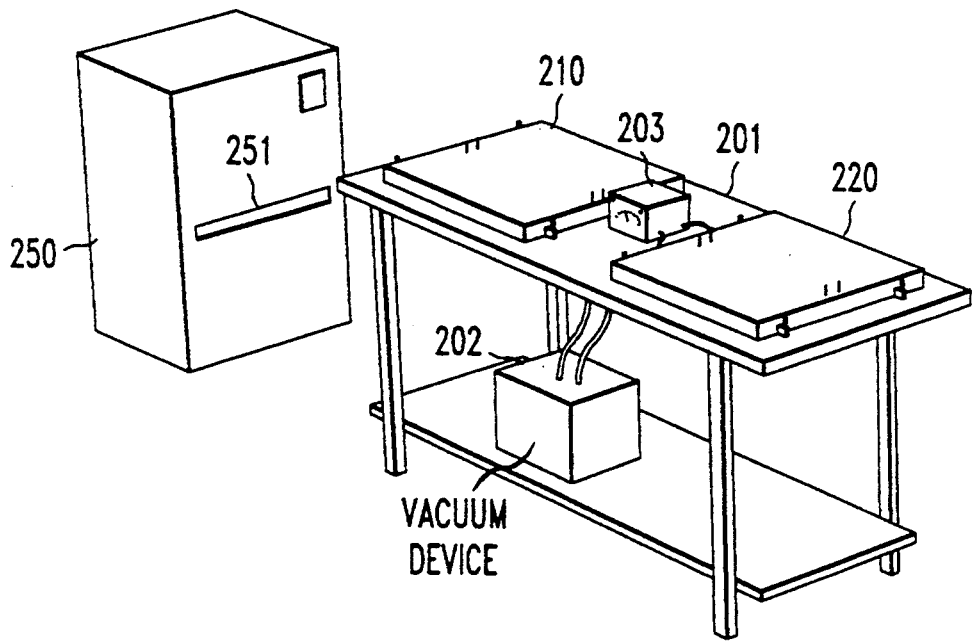
FIG. 2 is a pictorial view of a work station arrangement embodying the principles of the invention and utilizing the alignment fixtures of FIG. 1.

A preferred work station arrangement, as shown in FIG. 2, includes two alignment fixtures 210 and 220 positioned side-by-side on a work support table 201. A vacuum activator 202 is provided to energize the various vacuum operated devices of the alignment fixtures. The vacuum activator may be a discrete vacuum source 202 operative to draw a vacuum in the plenum of the alignment fixture. This activator may in the alternative comprise a source of compressed air connected by tubing to activate vacuum pumps. These vacuum pumps are preferably included in the housing of the alignment fixture and are activated by compressed air to generate a vacuum. These vacuum pumps which are included in the housing of the alignment fixture are connected through a manifold 1103 (shown in FIG. 11 ) to the apertures in the work surface. Additional vacuum distribution plumbing from vacuum pumps are directly connected to energize the corner deflectors of the alignment fixture. These vacuum pumps utilize a venturi effect which derives a vacuum from the applied compressed air flow. Devices to generate such a vacuum from compressed air are readily available commercially. A typical device, produced by PIAB Vacuum Products, is shown in FIG. 9. Compressed air is applied to the orifice 901 and exhausted at orifice 902. A vacuum suction is produced at the suction inlet 903 which in the present apparatus is connected to the suction manifold. A second, independently controlled vacuum device is connected by appropriate tubing or plumbing to the corner deflectors. Alternatively, a single vacuum source could be used with separately controllable valves leading to the working surface and to the corner deflectors.

A control mechanism 203, which is indexed manually, is provided to control which individual vacuum mechanisms of the alignment fixtures 210 and 220 are rendered operative, and also to control the operation of the alignment mechanisms. The control mechanism 203 may be embodied in a relay or semiconductor logic controlling a valving manifold; these valves control application of vacuum to the apertures and corner deflectors, and preferably also engage and disengage the alignment mechanisms (which are preferably actuated by pneumatic cylinders). This control mechanism is indexed by the operator, enabling sequenced application of a vacuum to the work surface, corner deflectors and the alignment mechanisms. The work station arrangement is used in combination with a photoprocessor 250 positioned nearby which illuminates the phototool-panel-phototool package after it is aligned and has been inserted into a slot 251 by the operator. The photoprocessors 250 are available commercially and need not be described in detail.

The preferred flow process in processing the panels is shown in the diagramed flow process shown in FIGS. 7 and 8. The process begins with the instructions of block 701 which have the operator load the two phototools onto tile first and second alignment fixtures. The operator engages the alignment mechanisms of both fixtures to align the phototools, in block 705, and operates the surface vacuum system of both fixtures to secure the phototools in place on the working surface as per block 709. The vacuum activated corner deflectors are activated to deflect the corners of the phototools below the working surface plane of the alignment fixture as per block 711.

Double sided adhesive is applied to the corners of the two phototools if not previously attached thereto, as directed by block 715. The alignment mechanisms of both stations are disengaged as per block 717. The panel is loaded and aligned on one of the alignment fixture surfaces as per block 719. The corner deflectors of this fixture is released and the corners of the phototool and panel are pinched together by the operator as per the instructions of block 721. The alignment mechanism is released and the surface vacuum is terminated (block 723) allowing the phototool/panel package to be removed from the alignment fixture. The package is flipped over and loaded on the other alignment fixture and aligned with the second phototool as per instructions in block 729. The corner deflectors are deactivated by removing the vacuum and the corners of the second phototool and panel are pinched together as directed by block 731. The alignment mechanism is disengaged and the vacuum chuck released as per block 733. The resulting phototool-panel-phototool package is removed and placed in a printer, as per block 739, for photoprocessing exposure.

In some applications it may be preferable to operate with only one alignment fixture. In this arrangement the first phototool is aligned and held on the work surface by vacuum. The panel is placed on the first phototool and aligned and secured. The second phototool is then placed on top of the panel and aligned. The phototool-panel-phototool sandwich is then pinched together and secured by the double sided adhesive. The alignment mechanism is released and the taped phototool-panel-phototool sandwich is removed from the alignment fixture for photo imaging. For engagement pins actuating in an outward direction, the tooling holes in the upper phototool would be positioned slightly closer to each other along the longitudinal axis 605 than the tooling holes in the panel are to each other along axis 505.

After photoimaging, the phototools, in both the double and single fixture arrangement, are stripped from the panel. The phototool(s) is (are) placed back on the alignment fixture(s) and aligned on the work surface(s). The phototool(s) is (are) then secured to the work surface(s) by applied vacuum and the corners containing the adhesive appliances are deflected by the corner deflectors. The panel in placed on (one of) the alignment fixture(s) and one of the processes described above is continued.

We claim:

1. A method of attaching phototools for photoprocessing of printed circuit panels;
comprising the steps of:
loading a first and a second phototool on a first and second alignment fixture, respectively;
aligning the first and second phototools with a reference point and axis on the first and second alignment fixtures, respectively, and securing the first and second phototools to a substantially planar surface of the first and second alignment fixtures, respectively;
mechanically deflecting corners of the first phototool from the plane of the planar surface of the first alignment fixture;
loading a panel to be processed onto the first phototool secured in the first alignment fixture and aligning it with the reference point and axis of the first alignment fixture;

inserting adhesive appliances between corners of the first phototool and the panel and pressing the corners of the first phototool through the adhesive appliance into contact with the corners of the panel thereby securing the panel and the first phototool to each other;

mechanically deflecting corners of the second phototool from the plane of the planar surface of the second alignment fixture;

loading the panel and the first phototool as a unit onto the second phototool secured in the second alignment fixture and aligning it with the reference point and axis of the second alignment fixture;

inserting adhesive appliances between corners of the second phototool and corners of the panel and pressing the corners of the second phototool through the adhesive appliance into contact with the corners of the panel thereby securing the panel and the second phototool to each other;

placing the panel with its attached phototools in a printer for exposure.

2. A method of attaching phototools for photoprocessing of printed circuit panels as claimed in claim 1; wherein the step of securing the first and second phototools to the planar surface includes applying a vacuum to the phototools through the surface.

3. A method of attaching phototools for photoprocessing of printed circuit panels as claimed in claim 1; wherein the step of deflecting corners includes the step of applying a vacuum to the corners.

4. A method of attaching phototools for photoprocessing of printed circuit panels as claimed in claim 1; wherein the step of aligning the first and second phototools includes the step of applying synchronized displacements via pins moving in opposing directions to engage structural features of the phototools.

5. A method of attaching phototools for photoprocessing of printed circuit panels as claimed in claim 1; wherein the step of aligning the panels includes the step of applying limited synchronized displacements via pins moving in opposing directions to engage structural features of the panels.

6. A method of attaching phototools for photoprocessing of printed circuit panels as claimed in claim 1; further including the step of securely affixing the adhesive appliance to the phototools and leaving the adhesive appliance substantially in place attached to the phototool to facilitate processing of multiple groups of panels with the same adhesive appliances.

7. A method of attaching phototools for photoprocessing of printed circuit panels;
comprising the steps of:
loading a first phototool on an alignment fixture;
aligning the first phototool with a reference point and axis on the alignment fixture, and securing the first phototool to a substantially planar surface of the alignment fixture;
mechanically deflecting corners of the first phototool from the plane of the planar surface of the alignment fixture;
loading a panel to be processed onto the first phototool, securing it in the alignment fixture and aligning the panel with the reference point and axis of the alignment fixture;

inserting adhesive appliances between corners of the first phototool and the panel and pressing the deflected corners of the first phototool through the adhesive appliance onto the corners of the panel thereby securing the panel and the first phototool to each other;

removing the first phototool and the panel joined in an intermediate assembly from the alignment fixture and flipping it over;

loading a second phototool on the alignment fixture;
aligning the second phototools with a reference point and axis on the alignment fixture, and securing the second phototool to a substantially planar surface of the alignment fixture;

mechanically deflecting corners of the second phototool from the plane of the planar surface of the alignment fixture;

loading the intermediate assembly to be processed onto the second phototool with the exposed panel side down and securing it in the alignment fixture and aligning the intermediate assembly with the reference point and axis of the alignment fixture;

inserting adhesive appliances between corners of the second phototool and the panel and pressing the deflected corners of the second phototool through the adhesive appliances onto the corners of the panel thereby securing the panel and the second phototool to each other and creating a final assembly of a first phototool to panel to second phototool package;

removing the final assembly as a unit from the alignment fixture;

placing the final assembly in a printer for exposure.

8. A method of attaching phototools to both sides of a panel for the subsequent photoprocessing of both sides of the panel;
comprising the steps of:
placing first phototool onto a first alignment fixture on a first work surface and aligning the first phototool to a first work surface reference system and securing the first phototool to the first work surface;

placing a panel onto the first alignment fixture and on top of the first phototool secured to the first work surface and aligning it to the first work surface reference system so that the first phototool and the panel are aligned with each other;

affixing the first phototool to an abutting side of the panel forming a first unitary package;
placing a second phototool onto a second alignment fixture on a second work surface and aligning the second phototool to a second work surface reference system and securing the second phototool to the second alignment fixture of the second work surface;

removing the first unitary package from the first work surface and turning it over and placing it onto the second alignment fixture and on top of the second phototool so that an exposed panel surface abuts the second phototool and aligning it to the second work surface reference system so that the first and second phototool and the panel are all aligned with each other;

affixing the second phototool to a side opposite the abutting side of the panel to form a second unitary package including the first phototool, the panel and the second phototool;

removing the second unitary package from the second work surface for photoprocessing of the second unitary package.

9. A method of attaching phototools to both sides of a panel for subsequent simultaneous photoprocessing of both sides of the panel as claimed in claim 8;
   wherein the step of affixing the first phototool to an abutting side of the panel forming a first unitary package include the steps of applying an adhesive adjacent to corners of the first phototool and bringing the corners of the first phototool with the adhesive into contact with adjacent corners of the panel; and
   wherein the step of affixing the second phototool to a side opposite the abutting side of the panel to form a second unitary package including the first phototool, the panel and the second phototool includes the steps of applying an adhesive adjacent to corners of the second phototool and bringing the corners of the second phototool with the adhesive into contact with adjacent corners of the panel.

10. A method of attaching a phototool to a panel for subsequent photoprocessing of the panel;
   comprising the steps of:
   placing a phototool onto a first alignment fixture included with a first work surface and aligning the phototool to a first work surface reference system and securing the phototool to the first work surface;
   placing a panel on top of the phototool secured to the first work surface and aligning it to the first work surface reference system so that the phototool and the panel are aligned with each other;
   affixing the phototool to a side of the panel forming a unitary package; and
   removing the unitary package from the work surface;
   placing a second phototool onto a second alignment fixture included with a second work surface and aligning the second phototool to a second work surface reference system and securing the second phototool to the second work surface;
   placing the unitary package onto the second alignment fixture on top of the second phototool so that an exposed panel surface is adjacent the second phototool and aligning the unitary package to the second work surface reference so that the phototool, second phototool and the panel are all aligned with each other;
   affixing the second phototool to an abutting aside of the panel to form a second unitary package including the phototool, the panel and the second phototool;
   removing the second unitary package from the second work surface for photoprocessing of the second unitary package.

* * * * *